(12) United States Patent
Adams et al.

(10) Patent No.: US 10,800,154 B2
(45) Date of Patent: Oct. 13, 2020

(54) HYBRID FUSION SYSTEM (71) Applicant: HEWLETT-PACKARD DEVELOPMENT COMPANY, L.P., Houston, TX (US)

(72) Inventors: Guy Adams, Bristol (GB); Steven J. Simske, Ft. Collins, CO (US); Luis Garcia Garcia, Barcelona (ES); Alejandro Manuel De Pena, Barcelona (ES); Pol Fornos, Barcelona (ES)

(73) Assignee: Hewlett-Packard Development Company, L.P., Spring, TX (US)

( * ) Notice: Subject to any disclaimer, the term of this patent is extended or adjusted under 35 U.S.C. 154(b) by 239 days.

(21) Appl. No.: 16/079,296

(22) PCT Filed: Oct. 17, 2016

(86) PCT No.: PCT/US2016/057331
§ 371 (c)(1),
(2) Date: Aug. 23, 2018

(87) PCT Pub. No.: WO2018/074993
PCT Pub. Date: Apr. 26, 2018

(65) Prior Publication Data
US 2019/0054729 A1    Feb. 21, 2019

(51) Int. Cl.
*B29C 64/135*    (2017.01)
*B29C 64/268*    (2017.01)
(Continued)

(52) U.S. Cl.
CPC .............. *B33Y 10/00* (2014.12); *B22F 3/105* (2013.01); *B29C 64/135* (2017.08);
(Continued)

(58) Field of Classification Search
CPC ......... B33Y 10/00; B33Y 70/00; B33Y 30/00; G06F 30/20; B29C 64/165; B29C 64/153;
(Continued)

(56) References Cited

U.S. PATENT DOCUMENTS 7,158,849 B2    1/2007  Huang et al.
7,778,723 B2    8/2010  Cregger
(Continued)

FOREIGN PATENT DOCUMENTS

CN    205165876 U    4/2016
EP     3067184 A1    9/2016
(Continued)

OTHER PUBLICATIONS

Peelamedu et al., "Sintering of Zirconia Nanopowder by Microwave-laser Hybrid Process", Journal of the American Ceramic Society, vol. 87, Issue No. 9, Retrieved from Internet: https://www.mri.psu.edu/sites/default/files/file_attach/113.pdf, 2008, pp. 1806-1809.

*Primary Examiner* — Nahida Sultana
(74) *Attorney, Agent, or Firm* — HP Inc. Patent Department (57) ABSTRACT

Methods of generating a three-dimensional object with an additive manufacturing system are described. The method includes depositing a build material within a working area, thereby providing a build material layer, selectively depositing a fusing agent onto a portion of the build material layer, applying energy from a bulk-fusion energy source to the working area, thereby fusing at least a portion of the build material where the fusing agent is deposited, and applying energy from a focused energy source to one or more localized areas of the working area.

15 Claims, 4 Drawing Sheets

(51) Int. Cl.
*B33Y 10/00* (2015.01)
*G06F 17/50* (2006.01)
*B29C 64/165* (2017.01)
*B29C 64/153* (2017.01)
*B22F 3/105* (2006.01)
*G06F 30/20* (2020.01)
*B33Y 70/00* (2020.01)
*B33Y 30/00* (2015.01)

(52) U.S. Cl.
CPC .......... *B29C 64/153* (2017.08); *B29C 64/165* (2017.08); *B29C 64/268* (2017.08); *B33Y 70/00* (2014.12); *G06F 30/20* (2020.01); *B33Y 30/00* (2014.12)

(58) Field of Classification Search
CPC ..... B29C 64/135; B29C 64/268; B22F 3/105; B22F 1/0074; B22F 2999/00
See application file for complete search history.

(56) References Cited

U.S. PATENT DOCUMENTS

| | | |
|---|---|---|
| 2006/0290772 A1 | 12/2006 | Hwang et al. |
| 2008/0131104 A1 | 6/2008 | Philippi |
| 2013/0287933 A1 | 10/2013 | Kaiser et al. |
| 2016/0129501 A1 | 5/2016 | Loewgren et al. |
| 2016/0167160 A1 | 6/2016 | Hellestam |
| 2019/0084227 A1* | 3/2019 | Paternoster ........... B29C 64/393 |
| 2019/0232371 A1* | 8/2019 | Ladewig ................. B33Y 30/00 |
| 2020/0009795 A1* | 1/2020 | Gibson .................. B33Y 10/00 |
| 2020/0016657 A1* | 1/2020 | Hart ....................... B33Y 30/00 |

FOREIGN PATENT DOCUMENTS

| | | |
|---|---|---|
| WO | 2016007207 A2 | 1/2016 |
| WO | 2016094827 A1 | 6/2016 |

* cited by examiner

HYBRID FUSION SYSTEM

BACKGROUND

Additive manufacturing systems that generate three-dimensional objects, including those commonly referred to as "3D printers", provide a convenient way to produce three-dimensional objects. These systems may receive a definition of the three-dimensional object in the form of an object model. This object model is processed to instruct the system to produce the object using one or more material components. This may be performed on a layer-by-layer basis in a working area of the system. Chemical agents, referred to as "printing agents", may then be selectively deposited onto each layer within the working area. In one case, the printing agents may comprise a fusing agent and a detailing agent, among others. In this case, the fusing agent is selectively applied to a layer in areas where particles of the build material are generally to fuse together, and the detailing agent is selectively applied where the fusing action is to be reduced. Energy may then be applied, such as using an infrared lamp, to fuse areas of a layer where fusing agent has been deposited. The process is then repeated for further layers. It may be desired to produce a three-dimensional object with one or more properties, such as color, mechanical and/or structural properties. Generating objects in three-dimensions presents many challenges that are not present with two-dimensional print apparatus.

BRIEF DESCRIPTION OF THE DRAWINGS

Various features and advantages of the present disclosure will be apparent from the detailed description which follows, taken in conjunction with the accompanying drawings, which together illustrate, by way of example, features of the present disclosure, and wherein.

DETAILED DESCRIPTION

In the following description, for purposes of explanation, numerous specific details of certain examples are set forth. Reference in the specification to "an example" or similar language means that a particular feature, structure, or characteristic described in connection with the example is included in at least that one example, but not necessarily in other examples.

In the production of three-dimensional objects, e.g. in so-called "3D printing", there is a challenge to produce objects with a large variety of object properties. For example, it may be desired to produce objects with a variety, e.g. selectable and variable characteristics, of one or more of the following specified properties: material properties, mechanical properties, physical properties such as color, detail, flexibility, surface texture, conductivity, and magnetism.

Certain examples described herein allow for applying uniform energy to a working area of an additive manufacturing system as a whole, as well as applying energy to specific, localized portions of the working area. In some examples, this allows for rapid production of objects with one or more of the specified properties described above, and/or allows for immediate correction of printing deficiencies.

In examples described herein, the working area defines the area in which build material is deposited and fused in order to make a three dimensional object. The working area also may be referred to as the print bed.

In certain examples herein, there is described an additive manufacturing system comprising a bulk-fusion energy source and a focused energy source.

A bulk-fusion energy source provides energy to the working area of an additive manufacturing system. A bulk-fusion energy source may be used to fuse a bulk portion of each layer of a three-dimensional object. In some examples, the bulk of a layer may refer to a majority of the build material which is to be fused. That is, in some examples, application of energy from the bulk-fusion energy source may fuse at least about 50% of the portion of build material to be fused, or 60%, or 70%, or 80%, or 90%. In some examples, the area to be fused by energy from the bulk-fusion energy source may have a width and height which each comprise a plurality of print resolution volumetric pixels, i.e. voxels.

In some examples, the bulk-fusion energy source may be an non-focused energy source. In some examples, the bulk-fusion energy source may provide energy to substantially all of the working area at substantially the same time. In these examples, the bulk-fusion energy source may be a static source. In other examples, the bulk-fusion energy source may provide energy to successive sections of the working area; that is, the bulk-fusion energy source may comprise a scanning source that scans across the working area to provide energy to the working area. The energy applied from such a bulk-fusion energy source to the working area is substantially uniform across the working area. In examples wherein the bulk-fusion energy source may provide energy to substantially all of the working area at substantially the same time, the energy applied from the bulk-fusion energy source to the working area may be substantially uniform across the working area at that time. In examples where the bulk-fusion energy source scans across the working area, the energy applied from the bulk-fusion energy source to the working area may not be substantially uniform across the working area at the same time, but the cumulative energy applied across the working area after one scan of the bulk-fusion energy source across the whole of the working area may be substantially uniform across the working area. According to examples described herein, the energy absorbed by the build material from the bulk-fusion energy source is sufficient to fuse at least a portion of the build material to which a fusing agent has been applied. In certain examples, the bulk-fusion energy source is an infrared energy source (for example, a short wave incandescent lamp). The bulk-fusion energy source may emit radiation across a broad range of wavelengths, the radiation having wavelengths of from about 700 nm to 1 mm, or from 700 nm to 100 μm, or from 750 nm to 5 μm.

A focused energy source provides energy to localized areas of the additive manufacturing system, e.g. the focused energy source is a localized energy source. In some examples, the focused energy source may be fixed, or it may scan across the working area in use. That is, energy emitted from the focused energy source does not, in certain cases, provide substantially uniform energy across the working area. Further, it may not provide substantially uniform energy across the working area at the same time, or where the focused energy source scans along the working area, the cumulative energy applied across the working area after one scan of the focused energy source across the working area may not be substantially uniform across the working area. In certain cases, the focused energy source provides a focused beam of energy that is applied to an addressable area or volume within the working area. In certain cases, this addressable area or volume is a print resolution volume, e.g. focused energy may be applied to the top and/or to the body of the voxel. In some examples, the focused energy source may emit radiation across a broad range of wavelengths. In other examples, the focused energy source may emit radiation across a narrow range of wavelengths, or emit radiation of substantially uniform wavelength. In some examples, the focused energy source may be a laser source. Focused energy sources according to certain examples described herein may emit radiation in the ultraviolet range, or the visible light range, or the infrared range, or a combination thereof. For example, radiation emitted from the focused energy source may have a wavelength of from about 150 nm to about 1 mm. In some examples, the radiation may have a wavelength of from about 200 nm to about 750 nm, or from about 200 nm to about 700 nm. In other examples, the radiation may have a wavelength of from about 700 nm to 1 mm, or from 700 nm to 100 μm, or from 750 nm to 5 μm. In some examples, the radiation emitted from the focused energy source may have a wavelength of less than 1 mm, or less than 100 μm, or less than 1 μm, or less than 750 nm, or less than 700 nm. In certain examples the focused energy source is a laser source. Examples of apparatuses for focusing energy on a localized area may include an array of lenses, a mechanically controlled mirror, or a variable refractive index material.

Certain approaches described herein using both a bulk-fusion energy source and a focused energy source provide benefits over comparative methods that use a bulk-fusion energy source, or a focused energy source, but not both sources. For example, certain examples described herein may provide faster throughput and greater accuracy that said comparative systems. A system which uses more than one fusing method as described herein may be referred to as a "hybrid fusing additive manufacturing system". A hybrid fusing additive manufacturing system, in some examples, may allow for production of three dimensional objects with multiple characteristics—for example, the focused energy source may allow for creation of a stiff material, and the bulk-fusion energy source for a more compliant material. The compliant material may allow for further folding/forming of the object after its production by the additive manufacturing system.

Figure 1:
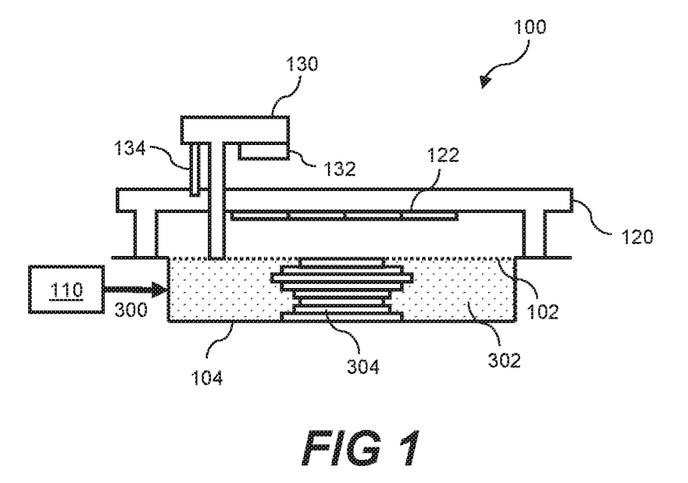
FIG. 1 is a schematic diagram showing components of an additive manufacturing system according to an example.

FIG. 1 shows an additive manufacturing system 100 according to an example. The additive manufacturing system 100 may comprise a supply mechanism 110 to deposit layers of build material 300 within a working area 102. The supply mechanism may comprise a build material supply, a build material preconditioning system, a build material spreading system, and a power advance system. The build material may comprise a polymer powder (or slurry, paste, gel etc.). In examples wherein the build material is a powder, the supply mechanism may comprise a powder supply, a powder preconditioning system, a powder spreading system, and a power advance system.

According to an example, the additive manufacturing system 100 may comprise a printing agent deposit mechanism 120. The printing agent deposit mechanism 120 may be configured to selectively deposit a plurality of printing agents to portions of the build material in the working area. The printing agent deposit mechanism may comprise a plurality of printheads 122, each configured to deposit particular print agent(s). In another example, the printing agent deposit mechanism may comprise a single printhead die, e.g. which extends across a width or height of the working area. The printing agent deposit mechanism 120 may be configured to move relative to the working area, e.g. scan above the working area in one or more dimensions.

According to certain examples described herein, printing agent may comprise a fusing agent, a detailing agent, and/or a functional agent.

A fusing agent may be applied to a layer of build material to enable fusing of defined areas of the layer following the application of fusing energy. Similarly, in certain cases, a detailing agent may be applied to areas of a layer of build material, for example to inhibit, or modify a degree of fusing. In an example, the detailing agent may reflect infrared radiation. A detailing agent may comprise titanium dioxide, for example.

For the avoidance of doubt, a fusing agent is different from a binding material (or "binder") in that a fusing agent acts as an energy absorbing agent that causes build material on which it has been deposited to absorb more energy than the build material would absorb in the absence of fusing agent. A binding material or binder chemically, on the other hand, acts to draw build material together to form a cohesive whole. In an example, the fusing agent may absorb infrared radiation. A fusing agent may comprise carbon black, for example.

A functional agent may be applied to a layer of build material to define areas which are to have different object properties. Objects produced from a single, bulk build material necessarily may have a limited variety of physical properties due to the homogeneity of the object structure. Providing a functional agent, though, may be used to introduce properties beyond those which can be provided by a single build material alone. In certain examples, the functional agent may provide the three dimensional object with one or more of the following specified properties: material properties, mechanical properties, physical properties such as color, detail, flexibility, surface texture, conductivity, and magnetism. Certain examples of functional agents include metallic loaded inks. Examples of metals for use in metallic loaded inks include silver, nickel titanium alloy, gold, copper, aluminum, bronze or zinc. In such examples, provision of energy from an energy source may serve to fuse the functional agent and/or build material on which the functional agent is deposited. In other examples, the functional agent may be a plasticizer, such as glycerin mono stearate (GMS), benzene sulfonamide (BSA), methyl 4-hydroxybenzoate (M4HB), and diethylhexyl phthalate (DOP). In certain examples, the plasticizer may act to produce or promote plasticity and flexibility, and to reduce brittleness, in portions of the build material on which it is deposited. In such examples, provision of energy from an energy source may serve to modify the build material, for example, it may anneal the build material. That is, in some examples, the energy source may supply energy to, and thereby heat a portion of build material upon which plasticizer has been deposited to an elevated temperature, for example around its softening temperature. The portion may then cool gradually, thereby relieving stress in the portion. In any case, provision of energy from an energy source to a functional agent that is deposited on build material may actuate a physical change in the functional agent and/or build material.

In certain examples, a functional agent may have an associated different amount of energy to actuate a physical change than that receivable by the bulk build material to fuse. For example, the functional agent may have an associated energy threshold to actuate a physical change that is higher than a corresponding threshold for the bulk build material to fuse. In these examples, it may be appropriate to provide energy from the focused energy source to the portions corresponding to functional agent further to the energy supplied by the bulk-fusion energy source.

A three-dimensional object undergoing additive manufacture may thus be built layer-by-layer within the working area 102. In certain cases, at least one agent may be deposited onto a layer of build material 300 that is formed within the working area 102 via a deposit mechanism, such as a thermal or piezo printhead or other suitable depositing mechanism. In FIG. 1, the working area 102 is shown comprising a platen or base 104, layers of fused build material 304 and a volume of unfused build material 302. The layers of fused build material 304 and volume of unfused build material 302 may be present during manufacture (e.g. as a series of layers are built upwards) but may not be present prior to manufacture.

In the present example, the additive manufacturing system also comprises a fusion system 130 arranged to apply energy to form portions of the three-dimensional object from combinations of the printing agents and the build material. In some examples, the fusion system 130 comprises an energy source such as one or more bulk infrared energy sources 132. In some examples, the fusion system comprises an energy source such as one or more laser sources 134. In certain examples described herein, the fusion system comprises one or more bulk infrared energy sources 132 and one or more laser sources 134.

Figure 2:
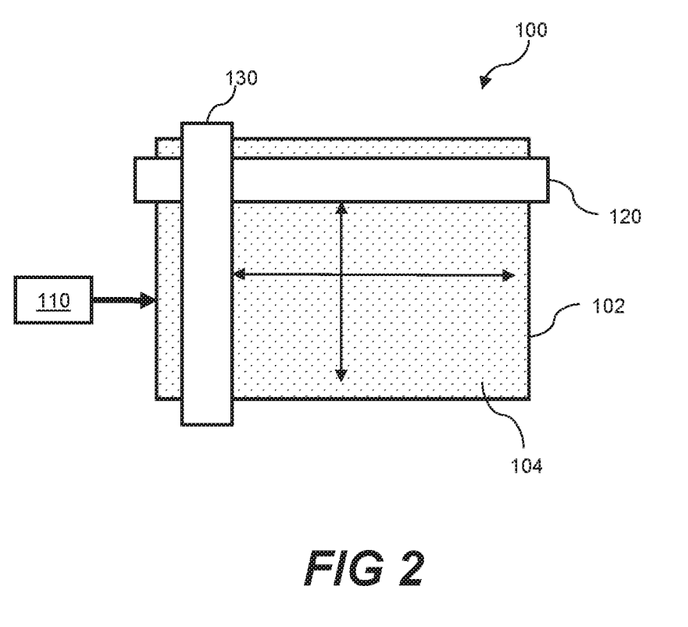
FIG. 2 is a plan view of the additive manufacturing system shown in FIG. 1.

In some examples, the fusion system 130 may travel across the working area in an orthogonal direction to the movement of the printing agent deposit mechanism 120, as shown in FIG. 2. As such both the printing agent deposit mechanism 120 and the fusion system 130 may be arranged to scan above the surface of the working area.

Figure 3:
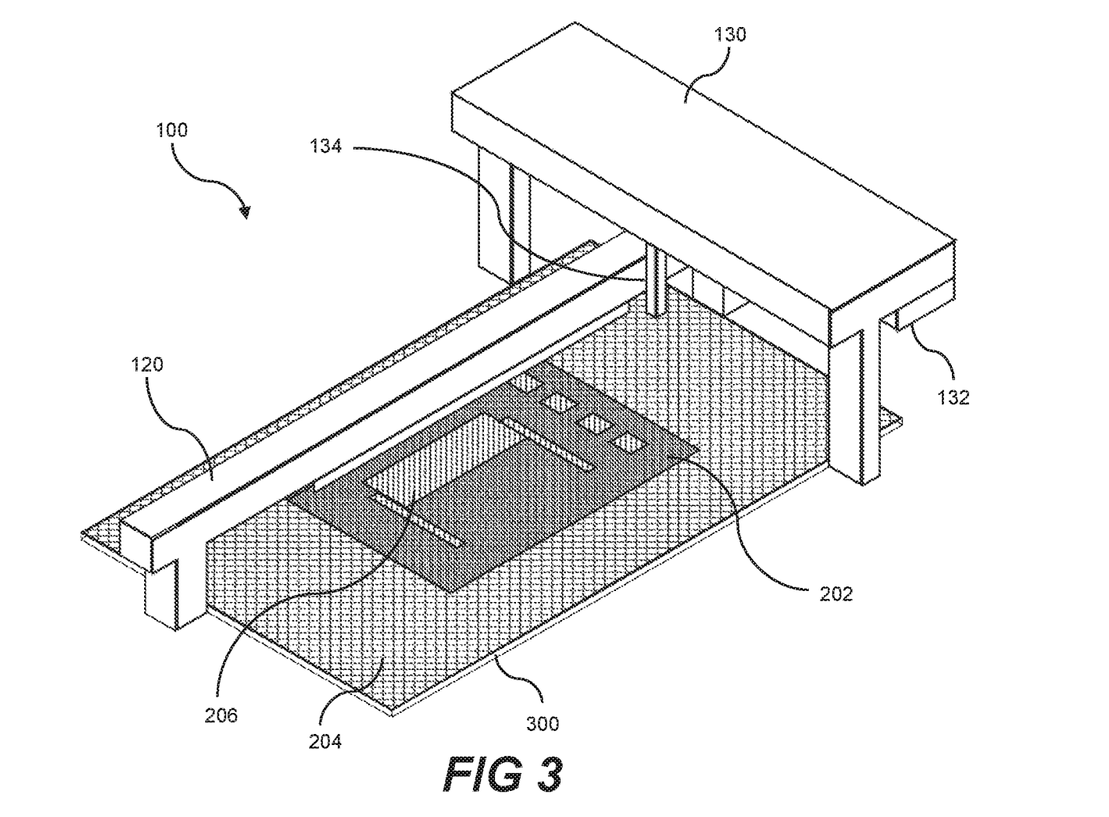
FIG. 3 is an isometric schematic illustration of an additive manufacturing system preparing a three-dimensional object with fusing agent, detailing agent and functional agent according to an example.

FIG. 3 shows a particular printing agent deposit mechanism 120 depositing a controlled amount of a printing agent onto an addressable area of the build material 300. In examples wherein the build material 300 has a particulate form e.g. were the build material is a powder, application of the printing agent to the build material 300 may thereby coat particles of build material 300. As such, a drop of agent on an addressable area unit of the layer relates to a print resolution volumetric pixel (a 'voxel'). In some examples, due to the conduction of thermal energy through the build material 300, the addressable unit area of the layer to which printing agent is applied may be smaller than the voxel area of build material 300 which is fused after application of energy from the fusion system 130. A voxel may have a surface width and/or height of 40 µm, for example. Following application of the agent the fusion system comprising one or more infrared energy sources 132 and one or more laser sources 134 is arranged to apply fusing energy to the portion of the layer 300. In some examples, the fusion system may apply energy uniformly to the whole layer from the infrared energy source 132. In some examples, the fusion system may apply energy to a localized portion of the layer from the laser source 134. The laser source 134 may apply energy to a localized portion after the infrared energy source 132 has applied energy to substantially the whole of the working area 102, for example. In certain examples, the localized portion is a voxel, or is a volume smaller than a voxel. The fusion system 130 may be moved along an axis of the working area 102 in order to provide energy from the infrared energy source 134 to substantially the whole working area. In further examples, the laser source 132 may move along an axis or axes relative to the fusion system 130 during manufacture of a three-dimensional object. In certain cases, a location of a beam from the laser source 134 may be controllable in two or three dimensions, e.g. via optical and/or mechanical mechanisms. In some examples, the laser source may comprise a laser beam generator, a laser controlling system and a laser orientation system. The laser orientation system may be a mechanical laser orientation system, an optical laser orientation system, or a combination thereof. A laser orientation system according to one example may mechanically move the laser beam generator across the surface of the working area to apply energy to any portion of the working area. In another example, a mechanically controlled mirror may direct a laser beam produced by the laser beam generator to any portion of the working area, wherein the laser beam generator is static or moveable. In a further example, a variable refractive index material may direct a laser beam produced by the laser beam generator to any portion of the working area, wherein the laser beam generator is static or moveable.

In some examples, upon application of energy from one or more of the energy sources, portions of build material 300 and fusing agent 202 may coalesce and solidify ("fuse"), whereas portions of build material 300 alone (or build material 300 and detailing agent 204) may not coalesce and solidify. In some examples, functional agent 206 may be applied to a portion of the addressable area of the build material 300. In some examples, the uniform energy supplied by the infrared energy source 132 may be insufficient to actuate a physical change in functional agent 206 and/or the build material thereunder. Thus, further energy may be supplied from laser source 134 to the localized areas corresponding to the functional agent in order to actuate a physical change in the functional agent 206 and/or the build material thereunder.

Generally, according to some examples, the method of generating a three-dimensional object may comprise determining portions of build material that are to receive additional energy after applying energy from the bulk-fusion energy source to the working area, and applying energy from the focused energy source to the determined portion of build material.

Figure 4:
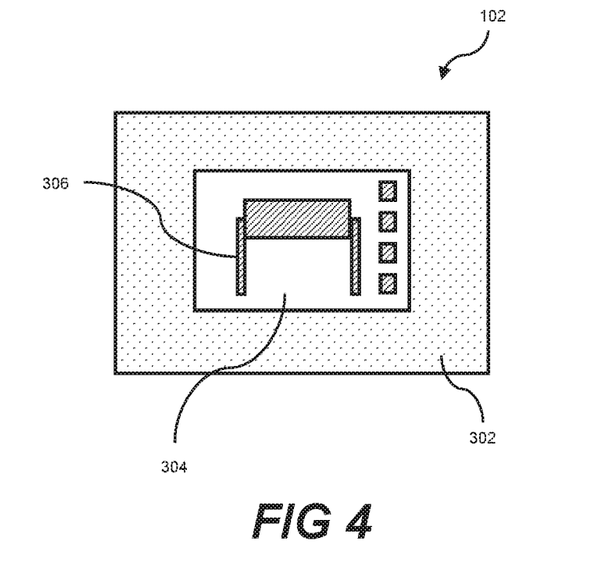
FIG. 4 is a schematic illustration of a working area with an object printed with fusing agent and functional agent according to an example.

FIG. 4 is a schematic illustration of a working area 102 with an object printed according to the application of printing agents shown in FIG. 3. In this example, unfused build material 302 surrounds fused build material 304. On the fused build material 304 there is provided functional agent in which a physical change has been actuated 306.

Figure 5:
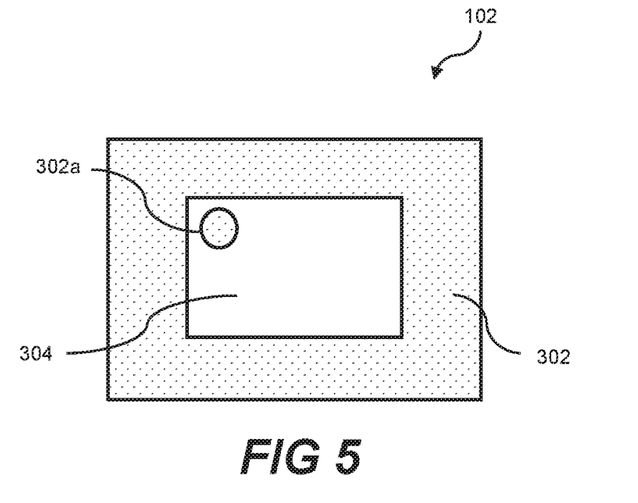
FIG. 5 is a schematic illustration of a working area with an object printed with fusing agent, wherein a portion of the object is unfused according to an example.

FIG. 5 is a schematic illustration of another application of a hybrid fusing additive manufacturing system. The schematic illustration represents a working area 102 to which energy from an infrared energy source 132 has been applied. A portion of fused build material 304 is surrounded by unfused build material 302. It may be that a portion of the build material 300, even though fusing agent has been applied thereon, is nevertheless still unfused build material 302a. That is, unfused build material 302a may be an area which was intended to be fused, but is not fused. In other examples, 302a is partially fused build material, or fused build material. In any case, the portion of build material 302a is a portion to which further energy is to be applied after application of energy from the bulk infrared energy source. In one example, wherein build material 302a is unfused or partially fused, the laser source 134 may apply energy to the build material 302a, thereby fusing build material to provide fused build material 304, and obviating the need for another application of energy from the bulk infrared energy source. This may be desired, as it removes the application of unnecessary energy to already-fused material. Unfused build material 302a may be detected by making temperature measurements. That is, a temperature measurement of the portion 302a may show that the portion of build material 302a is not of a temperature sufficient to fuse build material 300, and therefore remains unfused. Said temperature may be measured by thermal cameras and/or other temperature sensors.

There may be other applications of a hybrid fusing additive manufacturing system according to examples described herein. For example, the focused energy source may be used to reinforce portions of fused, partially fused or unfused build material. In one example, a layer definition may be provided from an object model. A generic erode filter may be applied to the layer definition, such that fine features of the layer definition are deleted. The layer definition may then be inverted, to provide a definition of the fine features only. The focused energy source may then apply energy to these fine features after energy has been applied from the bulk-fusion energy source, thereby reinforcing the fusing on the outer surface of the three dimensional object, and/or fusing portions with greater resolution and thereby more accurately fusing small features of the three dimensional object.

Figure 6:
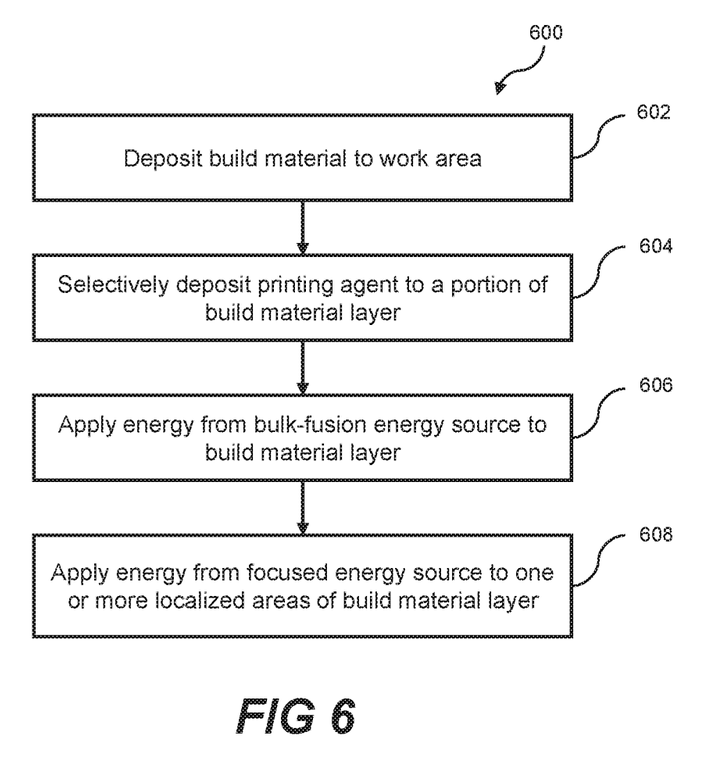
FIG. 6 is a flow diagram showing a method of generating a three-dimensional object with an additive manufacturing system according to an example.

FIG. 6 is a flow diagram showing a method of generating a three-dimensional object 600. In this example, the method 600 comprises depositing build material to a working area, thereby providing a build material layer 602.

Printing agent, including fusing agent, detailing agent and/or functional agent may then be selectively deposited on a portion of the build material layer 604. In some examples, deposition 604 comprises depositing fusing agent on a portion of the build material layer. Alternatively or additionally, it may comprise depositing detailing agent on a portion of the build material layer. Alternatively or additionally, it may comprise depositing functional agent on a portion of the build material layer. Deposition of a plurality of printing agents may take place at substantially the same time, or may be staggered in time.

Energy may then be applied from the bulk-fusion energy source to the working area 606. The application of energy may thereby fuse at least a portion of the build material where the fusing agent is deposited. In some examples the bulk-fusion energy source may be an infrared energy source. The energy applied from the bulk-fusion energy source to the working area may be substantially uniform across the working area. The bulk-fusion energy source may apply energy to the working area by moving along an axis of the working, so that energy is applied to substantially the whole working area.

In some examples, if there is deposition of functional agent, it may be deposited before or after the bulk-fusion energy source applies energy to the working area 606.

Energy may then be applied from the focused energy source to one or more localized areas of the working area 608. In some examples, the focused energy source is a laser source. In some examples, the localized area may be a voxel, or has a smaller volume than a voxel. In some examples, the localized areas correspond to areas of build material which are unfused even though fusing agent and energy from the bulk-fusion energy source has been applied thereto. In some examples, the localized areas correspond to portions of the working area where functional agent has been deposited on the build material layer. In one example, energy may be supplied from the focused energy source 608 after application of energy from the bulk-fusion energy energy source 606. In another example, energy may be supplied from the focused energy source 608 before application of energy from the bulk-fusion energy source 606. In another example energy may be supplied from the focused energy source 608 at substantially the same time as application of energy from the bulk-fusion energy source 606.

Figure 7:
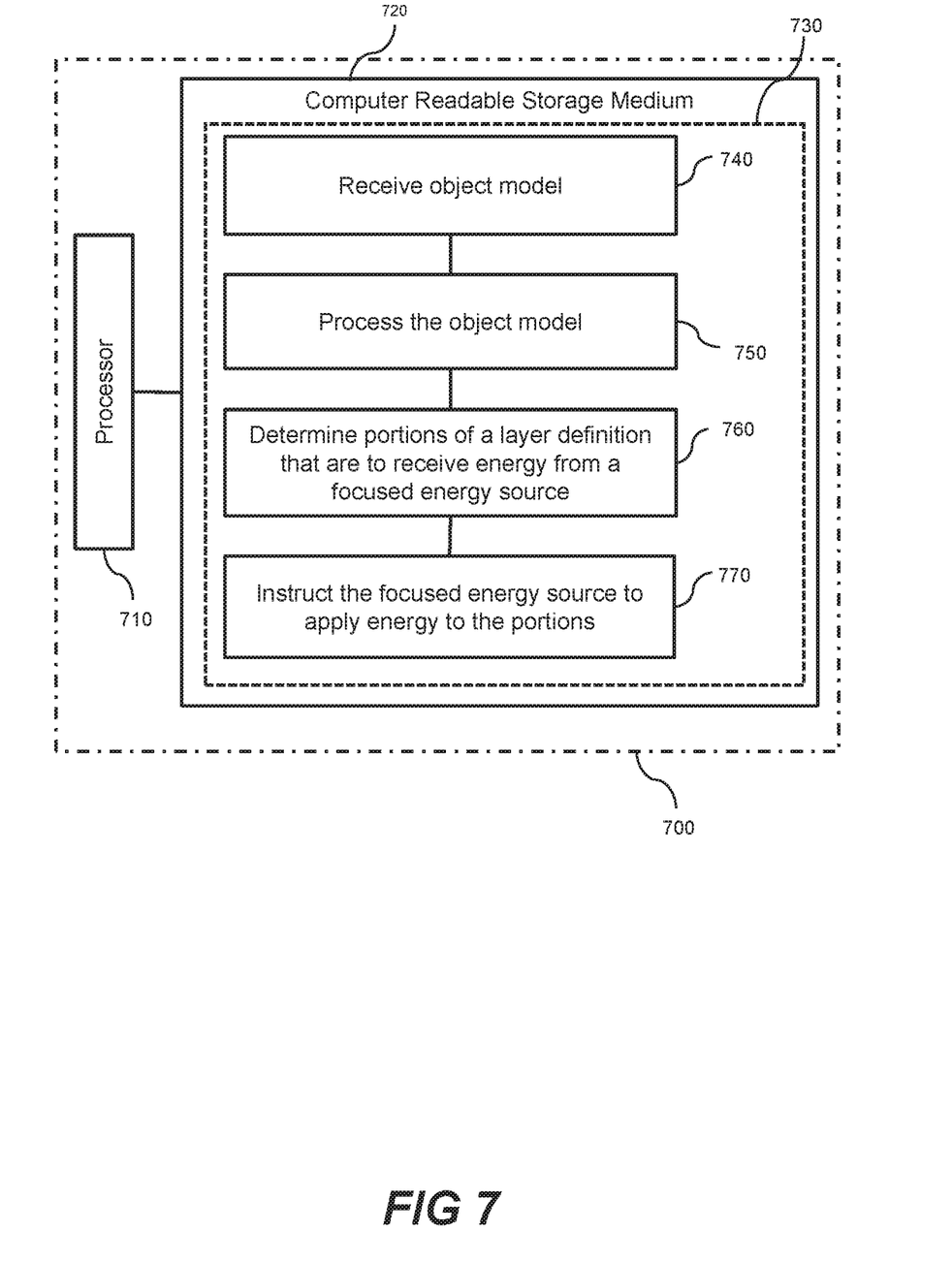
FIG. 7 is a schematic diagram showing a computing device according to an example.

FIG. 7 is a schematic diagram showing a computing device 700 according to an example. According to one example, there is provided a non-transitory computer-readable storage medium 720 comprising a set of computer-readable instructions 730 stored thereon, which, when executed by a processor 710 of an additive manufacturing system, cause the processor to carry out a number of steps.

In one example, the instructions 730 cause the processor to receive an object model 740. The object model defines the shape and nature of the three-dimensional object to be printed, i.e. the object model comprises data defining an extent of an object in three-dimensions.

The instructions 750 then cause the processor to process the object model to obtain a plurality of layer definitions. Each layer definition may comprise a plurality of print resolution volumetric pixels, i.e. voxels, defining a layer of build material to construct the object. Each layer definition may also comprise print data for depositing printing agents onto the layer, e.g. instructions indicating where printing agents are to be deposited onto voxels of a layer. The print data defines the area of the build material which is to be fused (portions on which fusing agent is deposited), and, if applicable, the portion of the build material which functional agent is to be applied thereto.

The processor may then determine portions of at least one layer definition for the application of a focused energy source 760, the portions comprising voxels that are to receive energy from a focused energy source further to energy received from a bulk-fusion energy source in order to actuate a physical change in the build material and/or functional agent as appropriate. This may be determined with regard to the printing agent data read 750. For example, the portions may correspond to a portion of the build material which functional agent has been applied thereto because, the energy from the bulk-fusion energy source may not be sufficient to actuate a physical change in the functional agent. In other examples, the portions may correspond to portions of the build material which fusing agent has been applied thereto, but has remained unfused or partially fused after energy has been applied from the bulk-fusion energy source thereto. In other examples, the portions may correspond to portions of fused build material which are to be reinforced by further application of energy from the focused energy source. In some examples, the bulk-fusion energy source is an infrared energy source. In some examples, the focused energy source is a laser source.

The processor may then instruct the focused energy source to apply energy to the portions 770. Application of energy from the focused energy source may actuate a physical change in a functional agent and/or build material.

Examples as described herein may use the focused energy source advantageously in order to accurately discriminate between fused and unfused portions of build material, and apply higher amounts of energy on small portions of build material, thereby improving said portions mechanical properties.

Examples as described herein may use the print deposition mechanism and bulk-fusion energy source advantageously in order to provide rapid and homogeneous fusion of build material.

Examples as described herein may advantageously use the print agent deposition mechanism, focused energy source and bulk-fusion energy source in concert, because application of print agent and energy from the bulk-fusion energy source prior to application of energy from the focused energy source may reduce the amount of energy to be applied from the focused energy source in order to actuate a physical change in the build material and/or functional agent, as appropriate.

The preceding description has been presented to illustrate and describe examples of the principles described. This description is not intended to be exhaustive or to limit these principles to any precise form disclosed. Many modifications and variations are possible in light of the above teaching. It is to be understood that any feature described in relation to any one example may be used alone, or in combination with other features described, and may also be used in combination with any features of any other of the examples, or any combination of any other of the examples.

What is claimed is:

1. A method of generating a three-dimensional object with an additive manufacturing system, the method comprising:
    depositing a build material within a working area, thereby providing a build material layer;
    selectively depositing a fusing agent onto a portion of the build material layer;
    applying energy from a bulk-fusion energy source to the working area, thereby fusing at least a portion of the build material where the fusing agent is deposited; and
    applying energy from a focused energy source to one or more localized areas of the working area.

2. The method of claim 1, wherein the focused energy source is a laser source.

3. The method of claim 1, where in the bulk-fusion energy source is an infrared energy source.

4. The method of claim 1, wherein the localized area is a print resolution volumetric pixel.

5. The method of claim 1, comprising:
    determining portions of build material that are to receive additional energy after applying energy from the bulk-fusion energy source to the working area, and
    applying energy from the focused energy source to the determined portion of build material.

6. The method of claim 1, further comprising depositing a functional agent onto a portion of the build material layer prior to applying energy from the localized energy source to the one or more localized areas of the working area.

7. The method of claim 5, wherein the localized area to which the energy from the focused energy source is applied corresponds to a portion of the working area where the functional agent is deposited.

8. The method of claim 5, wherein the functional agent is a metallic loaded ink.

9. The method of claim 7, wherein the functional agent comprises silver, nickel titanium alloy, gold, copper, aluminum, bronze, zinc, or a combination thereof.

10. The method of claim 5, wherein the functional agent comprises a plasticizer.

11. An additive manufacturing system comprising:
    a supply mechanism to supply a build material to a working area;
    a printing agent deposit mechanism to selectively deliver printing agent onto a portion of the working area;
    a bulk-fusion energy source to apply energy to the working area during construction of an object to fuse at least a portion of the build material; and
    a focused energy source to apply energy to a localized area of the working area during construction of an object.

12. The additive manufacturing system of claim 11, wherein the bulk-fusion energy source is an infrared energy source, and the focused energy source is a laser source.

13. A non-transitory computer-readable storage medium comprising a set of computer-readable instructions stored thereon, which, when executed by a processor of an additive manufacturing system, cause the processor to:
    receive an object model, the object model comprising data defining an extent of an object in three-dimensions;
    process the object model to obtain a plurality of layer definitions, each layer definition comprising a plurality of print resolution voxels defining a layer of build material to construct the object and print data for depositing printing agents onto the layer;
    determine portions of at least one layer definition for the application of a focused energy source, the portions comprising voxels that are to receive energy from a focused energy source further to energy received from a bulk-fusion energy source in order to actuate a physical change; and
    instruct the focused energy source to apply energy to the portions.

14. The non-transitory computer-readable storage medium of claim 13, wherein the bulk-fusion energy source is an infrared energy source, and the focused energy source is a laser source.

15. The non-transitory computer-readable storage medium of claim 13, wherein the portions correspond to localized areas associated with a functional agent.

* * * * *